United States Patent [19]

Allen et al.

[11] Patent Number: 4,796,038
[45] Date of Patent: Jan. 3, 1989

[54] LASER PATTERN GENERATION APPARATUS

[75] Inventors: Paul C. Allen, Beaverton; Paul A. Warkentin, Aloha, both of Oreg.

[73] Assignee: ATEQ Corporation, Beaverton, Oreg.

[21] Appl. No.: 178,868

[22] Filed: Mar. 28, 1988

Related U.S. Application Data

[63] Continuation of Ser. No. 867,205, May 27, 1986, abandoned, which is a continuation of Ser. No. 758,344, Jul. 24, 1985, abandoned.

[51] Int. Cl.[4] .......................... G03B 41/00; G01D 9/42
[52] U.S. Cl. .......................................... 354/4; 346/108
[58] Field of Search ...................... 354/4, 5; 346/76 L, 346/108, 160; 355/53; 219/121.76–121.83; 358/302; 369/121, 125

[56] References Cited

U.S. PATENT DOCUMENTS

| | | | |
|---|---|---|---|
| 3,573,849 | 4/1971 | Herriot et al. | 346/108 |
| 3,632,205 | 1/1972 | Marcy | 354/4 X |
| 3,797,935 | 3/1974 | Marcy | 354/4 X |
| 4,000,493 | 12/1976 | Spaulding et al. | 346/108 X |
| 4,201,455 | 5/1980 | Vadasz et al. | 350/358 |
| 4,293,202 | 10/1981 | Ohnishi et al. | 354/5 |
| 4,340,894 | 7/1982 | Oono et al. | 346/108 |
| 4,423,426 | 12/1983 | Kitamura | 346/108 |
| 4,517,608 | 5/1985 | Maeda et al. | 346/108 X |
| 4,541,712 | 9/1985 | Whitney | 355/53 |
| 4,554,561 | 11/1985 | Daniele et al. | 346/108 |
| 4,613,877 | 9/1986 | Spencer et al. | 354/4 X |
| 4,617,578 | 10/1986 | Nezu et al. | 354/5 X |
| 4,651,169 | 3/1987 | Muka | 354/108 |

FOREIGN PATENT DOCUMENTS

1596726   8/1981   United Kingdom .
2071858   9/1981   United Kingdom .
2096335A 10/1982  United Kingdom .

OTHER PUBLICATIONS

"Better Circuit Masks Exposed", Bell Labs., *Solid State Technologie*, vol. 13, No. 9, Sep. 1970, p. 18.

*Primary Examiner*—W. B. Perkey
*Attorney, Agent, or Firm*—Blakely, Sokoloff, Taylor & Zafman

[57] ABSTRACT

A laser pattern generation apparatus particularly suited for semiconductor applications. The laser beam is split into a plurality of beams and modulated with acousto-optic modulators. A rotating mirror having a plurality of facets causes the beam to scan the workpiece.

28 Claims, 7 Drawing Sheets

LASER PATTERN GENERATION APPARATUS

This is a continuation of application Ser. No. 867,205, filed 5-27-86, now abandoned, which is a continuation of application Ser. No. 758,344, filed 7-24-85, now abandoned.

BACKGROUND OF THE INVENTION

1. Field of the Invention

The invention relates to the field of pattern generation using a laser and radiant sensitive film, particularly for photolithography.

2. Prior Art

In the photolithographic fabrication of integrated circuits, films sensitive to radiant or particle energy are exposed in predetermined patterns to define circuit features. In some cases, the energy is passed through masks which contain the patterns, thereby selectively exposing a photoresist film on a semiconductor body. In other instances, the film is on a mask substrate and the film is exposed as a step in the making of the mask. Other times the direction of the radiant energy itself is controlled to define patterns in the film. This can be done as part of making a mask or to directly "write" onto the photoresist film covering a semiconductor wafer.

Several sources of radiant energy have been used, including ultraviolet light, visible light, coherent light, x-rays and electron beam (E-Beam).

In the very early days of photolithographic processing, patterns were manually cut on a large scale when compared to the final circuit, then photographically reduced to make the final masks. With today's technology, E-Beams are electrically directed to define patterns sometimes at the final scale.

There have been attempts to fabricate masks by directing laser beams and/or moving a work piece relative to laser beams. None of these attempts are commercially used. As will be seen, the present invention is directed to this area.

General pattern generation is described in U.S. Pat. Nos. 3,465,091; 4,060,816, and 4,464,030. Some aspects of UV mask making technology is described in U.S. Pat. Nos. 4,293,624 and 4,329,410. E-Beam technology is discussed in U.S. Pat. Nos. 3,679,497; 3,857,041, and 4,445,039. Laser pattern generation is described in U.S. Pat. Nos. 3,537,854; 3,622,742; 3,797,935; 3,925,785; 4,110,594, and 4,422,083.

The present invention uses acousto-optic modulators (AOM) to modulate a laser beam. In these modulators a sound wave propagating in crystal causes diffraction of light, thereby permitting the light to be modulated. This phenomenon has been known for many years and, for example, is discussed in "Acousto-optic Bragg Diffraction Devices and their Applications", by Walter Baronian, *IEEE 74 Region 6 Conference,* beginning at page 70. The use of acousto-optic modulators for electronic printing is discussed in "Laser Scanning for Electronic Printing", *Proceeding of the IEEE,* Vol. 70, No. 6, June 1982, beginning at page 597.

SUMMARY OF THE INVENTION

An apparatus for generating a pattern on a workpiece where the workpiece includes a film responsive to radiant energy is described. A laser is used for the source of radiant energy and the beam from the laser is split into a plurality of beams. These beams are passed through acousto-optic modulators which modulators receive electric signals defining the patterns. A steering mirror is provided for steering the beams through a zoom lens and directing the beams to a rotating mirror. The steering mirror may be used to adjust the beams in response to movement of the workpiece. The rotating mirror has a plurality of facets is used to direct the beams from the modulator in scan patterns as the workpiece is moved. Thus, the workpiece is written onto in a raster-like scan.

An enlarged intermediate image plane is established following the rotating mirror with an F-theta lens; light is taken from this plane for system control. A beam splitter in this plane causes a beam to be deflected from the plane and detected to provide a timing signal synchronized with mirror rotation. The same beam splitter is used to deflect a beam reflected from the workpiece into a photomultiplier tube. This beam is used to determine workpiece location (e.g., for calibration).

Other aspects of the present invention will be apparent from the detailed description.

DETAILED DESCRIPTION OF THE INVENTION

A laser pattern generating apparatus is described which is particularly suitable for selectively exposing photosensitive layers such as photoresist layers used in the fabrication of integrated circuits. In the following description, numerous specific details are set forth such as specific wavelengths, lenses, etc., in order to provide a thorough understanding of the present invention. It will be obvious, however, to one skilled in the art that the present invention may be practiced without these specific details. In other instances, well-known structures, support members, etc., not necessary to the present invention, are not been set forth in detail in order not to unnecessarily obscure the present invention.

OVERVIEW OF INVENTION

The pattern generation apparatus of the present invention uses a laser beam to expose a radiant sensitive film. The laser beam is split into eight beams to creat a brush. The brush scans the workpiece through use of a rotating mirror. Each beam of the brush is modulated through acousto-optical modulators. The electrical signals coupled to these modulators determine the specific pattern which is generated. The "rasterizer" system used for providing the electrical signals to the modulators is described in copending application, Ser. No. 784,856, filed Oct. 4, 1985 which is assigned to the assignee of the present invention.

The workpiece containing the photosensitive film is mounted on a movable table which moves in one axis during scanning (stripe axis). The table also moves in the scan axis when writing is not occurring. Interferometers detect movement of the workpiece in these axes. A determination of workpiece position relative to beam position is made from reflected light in a telecentric enlarged image plane. This same image plane is used for mirror facet detection, thus permitting data synchronization to the acousto-optical modulators.

OPTICAL PATH OF THE INVENTED APPARATUS

Figure 1:
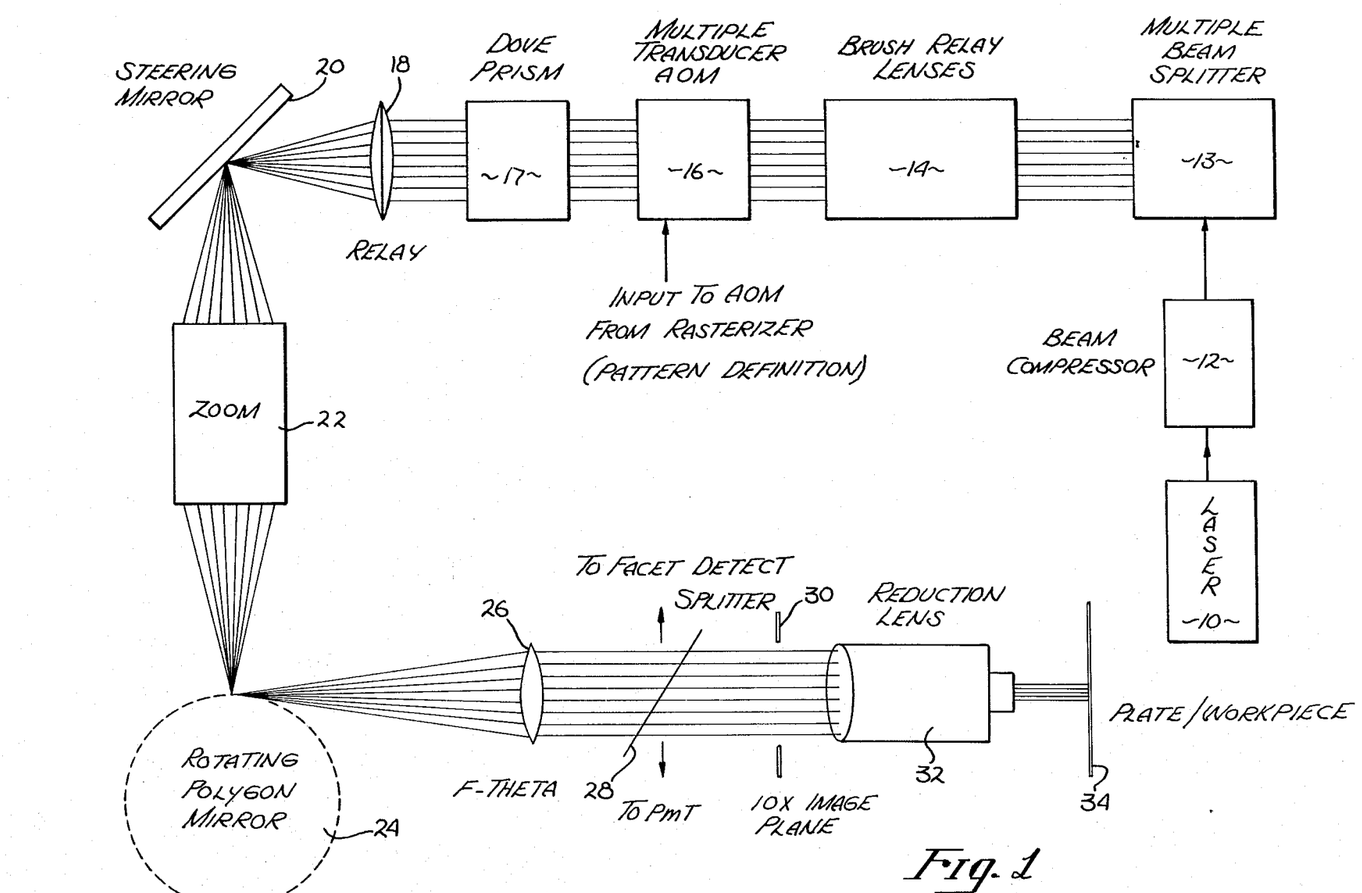
FIG. 1 is an optical schematic showing the overall optical path in the apparatus of the present invention.

Referring to FIG. 1 in the currently preferred embodiment a continuous wave laser 10 providing 100-200 milliwatts of radiation at a frequency of 363.8 nm is used. The beam from laser 10 is compressed through ordinary beam compressor 12 to prepare the beam for splitting.

The multiple beam splitter 13 splits the beam from the laser 10 into eight beams. The specific optical arrangement for providing this splitting is described in conjunction with FIGS. 3 and 4.

The eight beams from the splitter 13 (sometimes referred to collectively as the "brush") passes through the relay lenses 14. This three element lens (shown in FIG. 2), in effect, focuses and shrinks the beams from the splitter 13 by approximately a factor of two.

Commercially available acousto-optical modulators (AOMs) 16 are employed to modulate the light beams. In the presently preferred embodiment, eight transducers are formed on the surface of a single crystal. A carrier of 160 MHz is used, that is, the presence of the carrier determines whether the beam will be diffracted through the crystal onto the workpiece; the amplitude of the carrier determines the intensity of the beam. (The zero order beam is not used.)

Eight modulated beams may be obtained from a single beam using a single AOM where eight carrier frequencies are used. The deflection from the AOM is a function of frequency and each carrier frequency creates a separate beam. Alternatively, electro-optic modulators may be employed in place of the AOMs. Neither of these are used in the currently preferred embodiment.

The eight beams from the AOM are directed through a dove prism 17. This prism is used to rotate the brush of beams, and while not easily demonstrable in the view of FIG. 1, the beams, in effect, are tilted out of the plane of the figure. The ultimate brush formed by the beams comprises overlapping projections of each of the beams without interference between the beams since in addition to the rotation from prism 17, a time delay is used between the activation of each of the beams. If this is not done non-uniform exposure of the photoresist can result.

The beams from prism 17 pass through the single relay lens 18 to converge to a spot on the steering mirror 20. In the currently preferred embodiment, this spot is approximately 1.5 mm in diameter. The steering mirror 20 is an electrically controllable mirror which permits the beams' angles to be moved (adjusted) on the facets comprising mirror 24. The beams reflecting from mirror 20 pass through the zoom lens 22 which comprises four elements shown in FIG. 2. This zoom lens permits the beams to be made larger and moved further apart or to be made smaller and closer together on the workpiece. This zoom is electrically controlled and is set for each workpiece.

The rotating polygon mirror 24 in the currently preferred embodiment comprises 24 facets each of which deflect the beams from the zoom lens 22 into the F-theta lens 26. It is this mirror which provides the scanning action of the beams. In the currently preferred embodiment, this mirror rotates between 12,000 to 20,000 rpms; thus, the scans occur at a rate between 48 kHz and 80 kHz per second. However, the mirror rotates at a constant rate for a given pattern.

Figures 4, 5:
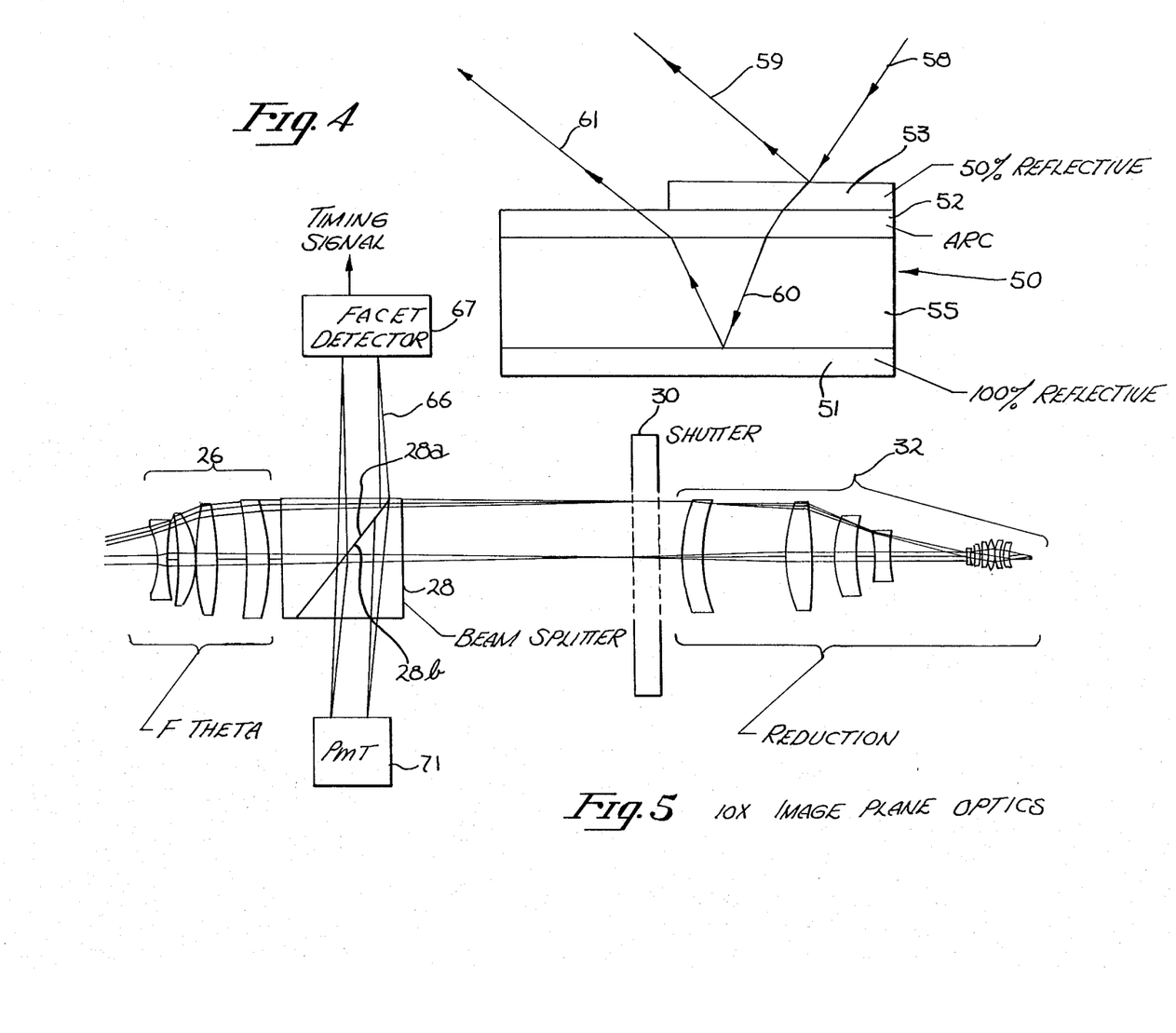
FIG. 4 is an elevation view of one of the splitters used in the beam splitter of FIG. 3.
FIG. 5 is a diagram showing the lenses used in the post-scan, intermediate image plane.

The beams from mirror 24 are enlarged in a post-scan, intermediate image plane (10× image plane) as shown in FIG. 1. At one end of this plane, F-theta lens 26 is used to form the plane and at the other end a reduction lens 32 is used to provide the final beams. The final reduced beam scans the plate or workpiece 34. The lenses of the F-theta lens arrangement and reduction lens 32 are shown in FIG. 5.

A splitter 28 is disposed in the 10× image plane. As will be described later, one of the beams is activated prior to each scan and is used to detect the mirror facets. The beam is reflected from splitter 28 to a facet detect circuit which provides a pulse indicating facet position. This permits the pattern data to the AOM 16 to be synchronized with the mirror rotation. Reflections from the workpiece 34 (or its part holder) are also reflected by the splitter 28 and focused into a photomultiplier tube. These reflections are used for calibration and other purposes as will be described later.

A shutter 30 operates in the 10× image plane. This shutter prevents light from reaching the workpiece except during scanning or other selected times such as at calibration.

Figure 2:
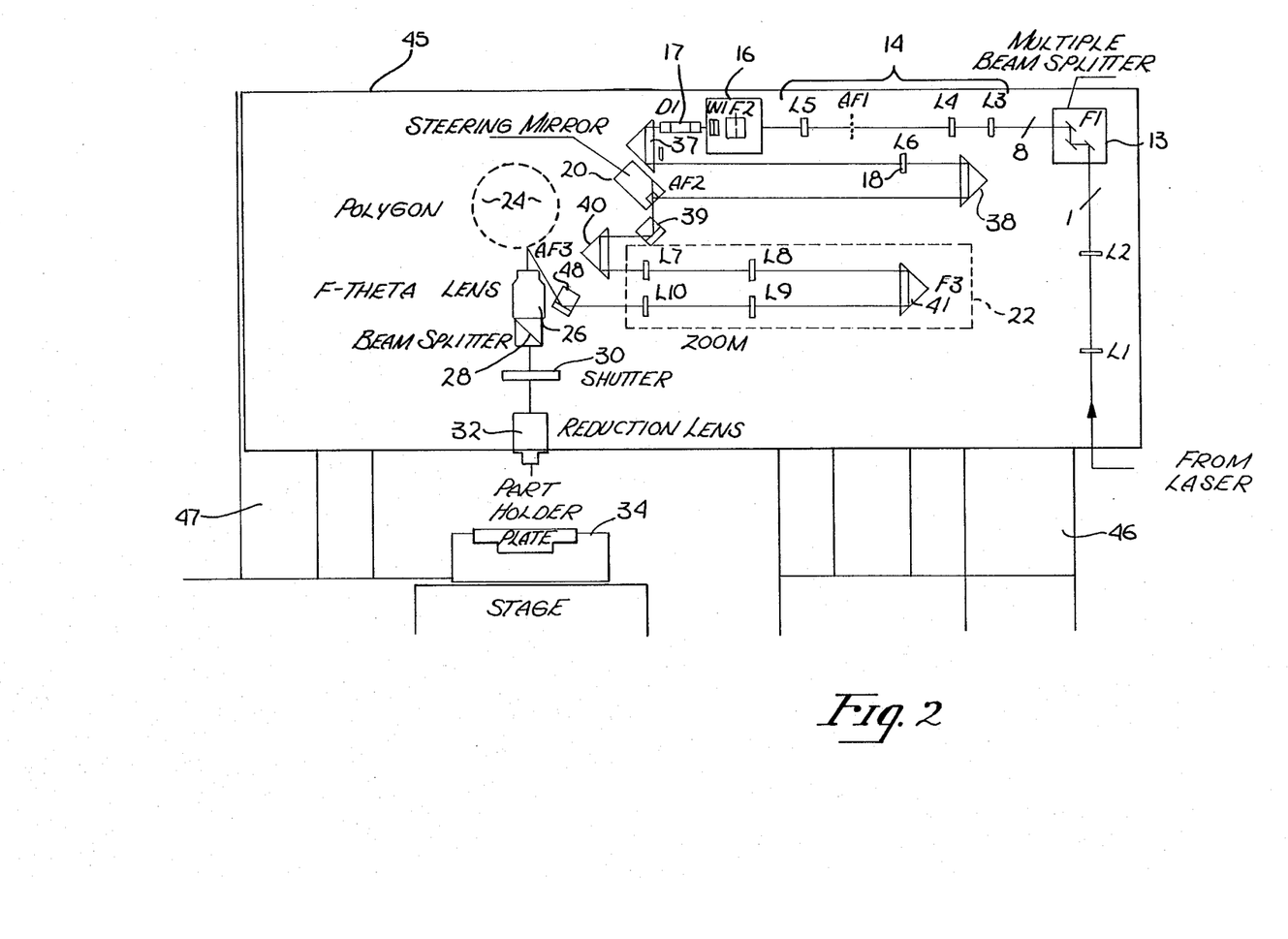
FIG. 2 is an elevation view of the apparatus of the present invention in schematic form principally to illustrate the location of the lenses in the optical path and their relationship to the part holder.

In FIG. 2 the actual optical path as currently realized is shown. The laser, lenses, rotating mirror, etc., are mounted to a rigid metal frame 45. The frame is supported by metal supports 46 and 47 which are mounted on a single granite member to minimize movement. The workpiece or plate is secured on the part holder and this assembly, as will be described, moves below the reduction lens 32.

In the optical path of FIG. 2, the designation "L" refers to lenses, the designation "F" refers to focal points, and the designation "AF" refer to afocal points.

The beam from the laser passes through lenses L1 and L2 which are the beam compressor 12 shown in FIG. 1. The beam is then focused into the beam splitter 13 which, as mentioned, will be described later with FIGS. 3 and 4.

The relay lenses 14 of FIG. 1 are formed by lenses L3, L4 and L5 which include the afocal point AF1 between lenses L4 and L5. The AOM 16 is again shown and receives the eight beams from the lenses 14. The modulated light from the AOM passes through the dove prism 17 and then through the beam folding prism 37, relay lens 18 (L6), beam folding prism 38, and onto the steering mirror 20. From there the beams are reflected from mirror 39, pass through the beam folding prism 40 and are directed to the zoom lens assembly which comprises lenses L7, L8, L9, L10 and the beam folding prism 41. A focal point F3 is located within the prism 41. The beams from the zoom lens assembly then are reflected by mirror 48 onto the rotating mirror (polygon) 24.

The post-scan optics are again shown in FIG. 2 which includes the F-theta lens 26, the beam splitter 28, shutter 30 and reduction lens 32.

All the lenses discussed above are commercially obtainable.

BEAM SPLITTER 13 OF FIGS. 1 AND 2

FIG. 4 shows one of the three similar plates 50 used in the beam splitter. The body 55 is an ordinary body such as glass which transmits the beam. The upper surface of the body includes an anti-reflective coating 52. Partially covering this coating is a 50% reflective coating or layer 53. On the lower surface of body 55 a 100% reflective coating or layer 51 is formed.

As is seen, a beam 58 incident on layer 53 is reflected as shown by beam 59. A portion of the beam 58 shown as beam 60 enters the body 55 and is reflected from the coating 51 (beam 61). Note that the beam 61 upon exiting the plate 50 does not strike the layer 53.

Figure 3:
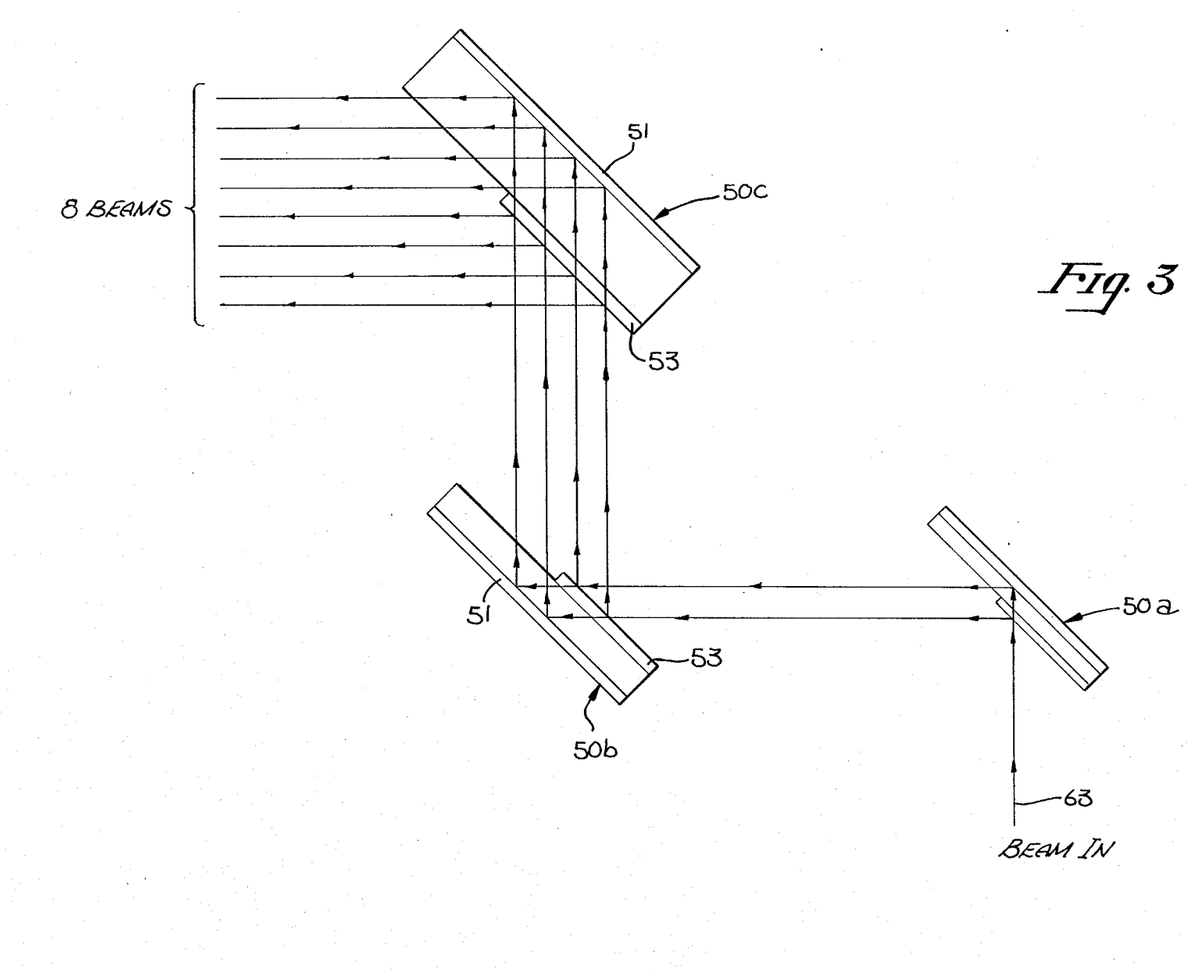
FIG. 3 is a diagram of the beam splitter used in the presently preferred embodiment.

Three plates such as plate 50 of FIG. 4 are shown in FIG. 3 (plates 50a, 50b and 50c) and are used to provide eight beams in the presently preferred embodiment. Plate 50b is twice as thick as plate 50a; plate 50c is twice as thick as plate 50b. The plates are mounted parallel to one another in the currently preferred embodiment.

As seen in FIG. 3 a beam 63 first striking plate 50a provides two beams. (This is also shown in FIG. 4.) The two beams are then incident on the layer 53 of plate 50b. Half of each of these beams is reflected from layer 53. The portions of the beams which pass through layer 53 are reflected by layer 51 to provide two additional beams, thus a total of four beams leave the plate 50b. In a similar fashion, all four beams from plate 50b are partly reflected from the layer 53 of plate 50c and four beams are reflected from layer 51 of plate 50c to provide the eight beams used in the presently preferred embodiment.

10× IMAGE PLANE OPTICS

One aspect of the present apparatus is its use of an enlarged image plane following the scan optics. In the currently preferred embodiment, a 10× image plane is used between the rotating mirror and the workpiece. This intermediate telecentric image plane assists in facet detection, calibration and workpiece position determination, particularly for direct write applications.

Referring to FIG. 5, the intermediate plane is created by the F-theta lenses 26. Known F-theta lens technology is used to create the intermediate plane following the rotating mirror.

Figure 10:
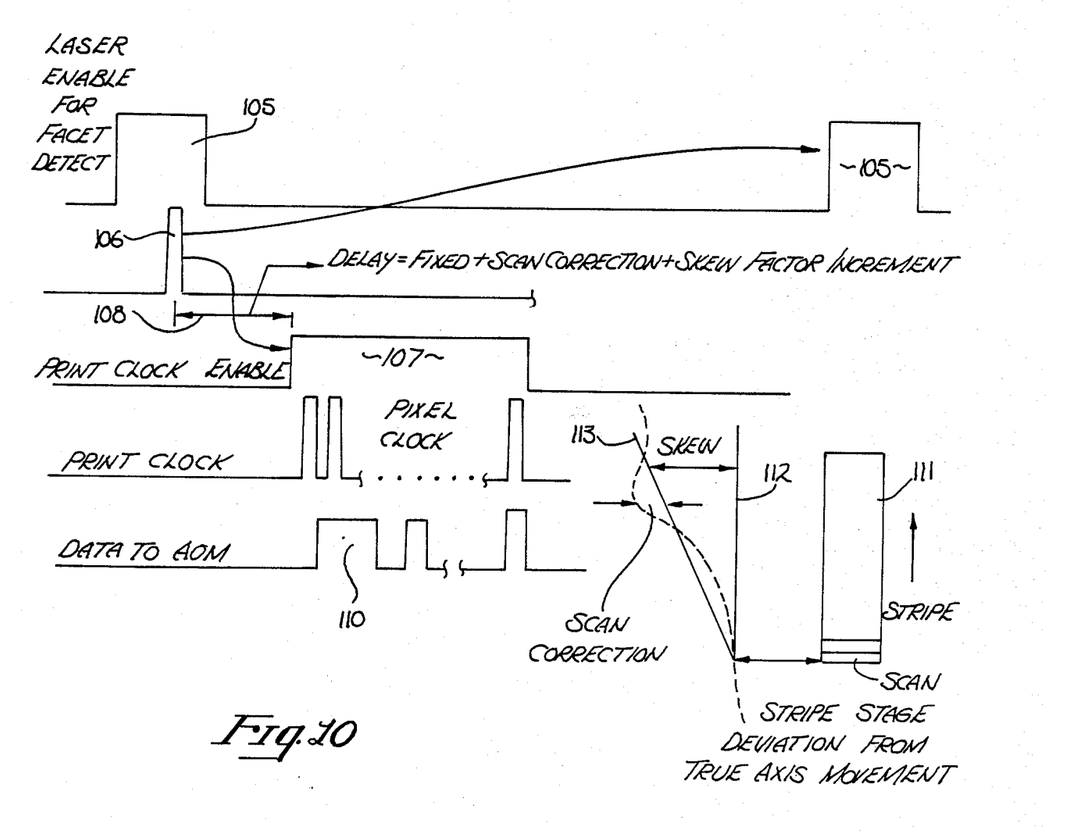
FIG. 10 is a timing diagram used to describe certain aspects of the present invention.

A beam splitter 28 is disposed in the light path following the F-theta lenses. This beam splitter is used to split away a small portion of the light directed at the workpiece to a facet detector 67. An ordinary photodiode or like device is suitable for the facet detector 67. Beams 66 of FIG. 5 are shown reflected from the surface 28a of the beam splitter and are incident on the detector 67. As will be discussed in more detail, one of the beam channels is turned on through the AOM prior to each scan of the workpiece. The facet detector detects this beam and this information is used to time the data coupled to the AOM. This is shown in FIG. 10. The other surface 28b of the beam splitter 28 is used to split a portion of the beam reflected from the workpiece. This light which is coupled to a photomultiplier tube 71 is used for calibration and position detection.

A shutter 30 is positioned within the intermediate image plane as shown in FIG. 5. The AOM, when off, still permits a small amount of light (e.g., 1%) to be diffracted onto the workpiece. When the stage carrying the workpiece is stopped, this light can cause unwanted exposure of the photoresist. The electrically operated shutter is closed when scanning onto the workpiece is not occurring. (The beam of channel 1 which is turned on before actual scanning for facet detection, as previously mentioned, does not fall onto the workpiece.

The shutter 30 is positioned past the splitter 28 since facet detect signals are used for moving the table. Note that if the shutter were further upstream in the optical path, facet detect signals would not be received when the shutter was closed, thereby preventing generation of timing signals used to move the table.

The reduction lens assembly 32 is a commercially obtainable reduction lens which focuses the beams from the 10× plane onto the workpiece.

WORKPIECE WRITING FORMAT

The scan pattern and workpiece movement permit the eight beams to write virtually any pattern. While the particular writing format employed is not crucial to the optical path, an explanation of the format assists in understanding the overall operation of the invention.

Figure 8:
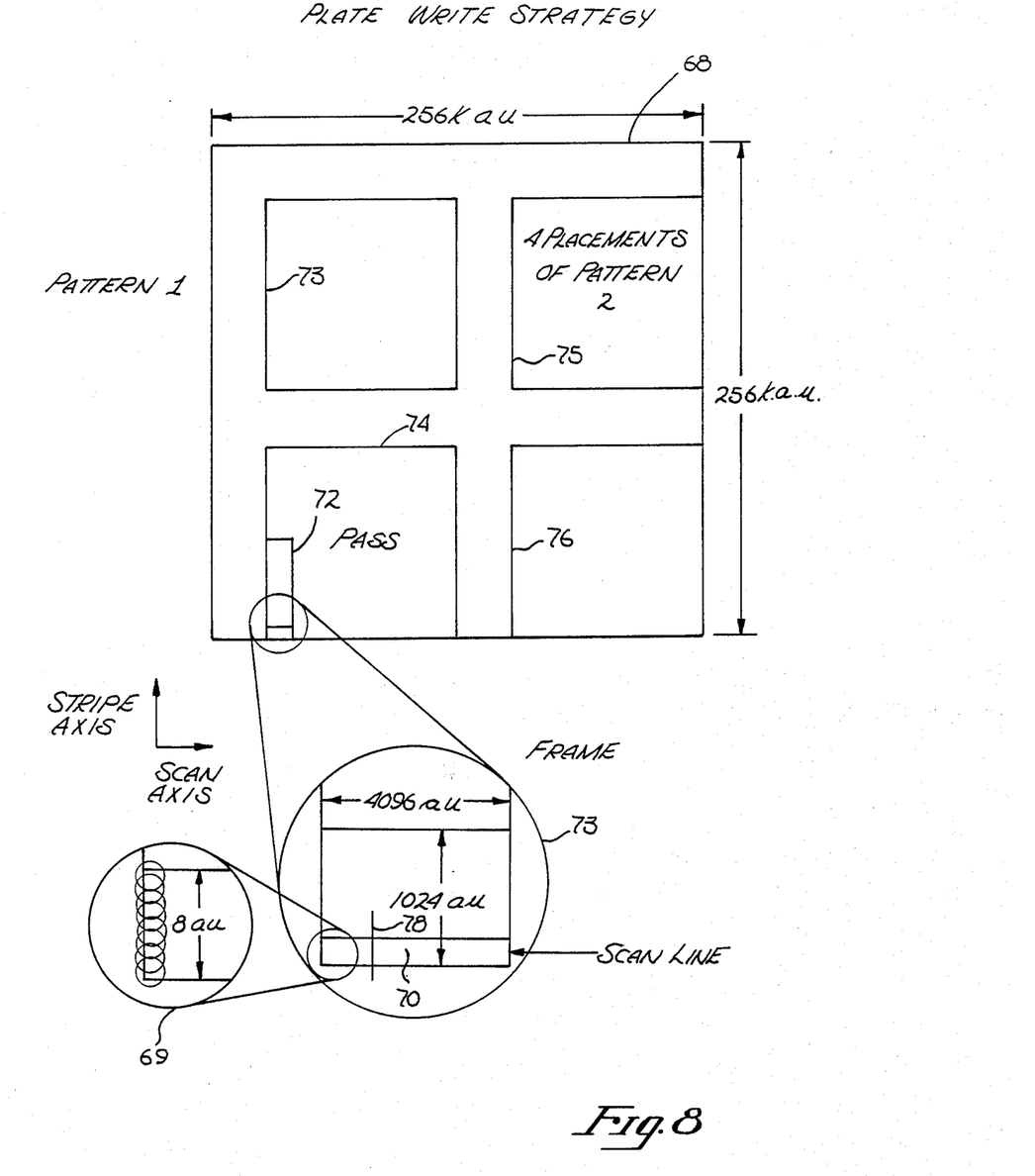
FIG. 8 is a diagram used to illustrate the scan patterns (plate write strategy) used in the presently preferred embodiment.

The patterns are generated in blocks on the workpiece such as block 68 shown in FIG. 8. Each block uses 256K address units of data in the scan axis and 256K address units in the stripe axis. A single address in both axes defines a 0.5 micron square.

The beams are caused to scan by the rotating mirror in the scan axis direction. The eight beams are shown within circle 69. The brush formed by these beams paints a scan line 70 shown within circle 73. As this scanning occurs, the workpiece is moved in the stripe direction. Thus, the scanning proceeds in a raster-like manner. Each scan line, as presently implemented, is 4096 address units wide with one bit being used in each address unit for controlling each of the beams. Therefore, the scan line itself is 8 "bits" wide. The binary code is used to either turn on or turn off its respective beam. A gray scale may also be used where a plurality of bits are associated with each beam to provide gradation between the on and off states.

In the rasterizer used with the pattern generation apparatus, frames are generated which are 1024 address units long in the stripe axis direction. However, this delineation is not detectable within the beam or table movement itself, but rather is confined to the rasterizer. A plurality of frames are used to provide a pass such as defined by the rectangle 72. The number of the frames in a pass is arbitrary.

Assume for purposes of discussion that four identical patterns (pattern 2) are to be written within the block 68. In the presently preferred embodiment, pass 72 is first written into block 74 and then the table is moved so that the same information contained in that pass can be rewritten into the blocks 73, 76 and then 75. Another pass is then made in each of the blocks until the entire pattern has been written four times within block 68. Other patterns may be written on the workpiece in blocks adjacent to blocks 68 such as shown by pattern 1 to the left of block 68. The pattern 1 or 2 of FIG. 8 may represent, by way of example, 5× or 10× masks, or as mentioned, may represent circuit elements generated directly on a semiconductor wafer.

As currently implemented, the beams only write in conjunction with stripe axis movement and no writing occurs when the table is moved in the scan axis. Workpiece movement in the scan axis occurs, for instance, to reposition the workpiece for each pass.

SCAN LINE BEAMS

Figure 9:
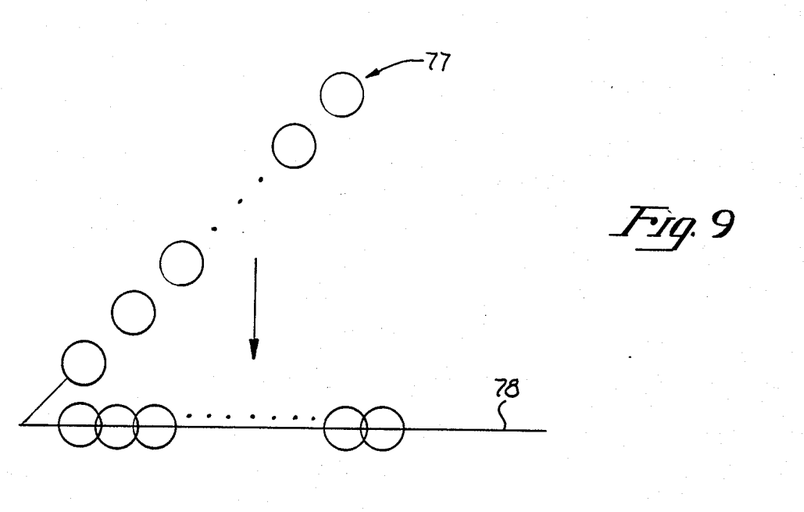
FIG. 9 illustrates the laser beams used to form a "brush".

In circle 69 of FIG. 8 the eight beams which paint the pattern in each scan are shown overlapping one another. In reality, the beams do not overlap although their projections on the workpiece overlap. The dove prism 17 of FIG. 1 orients the beams so that they are spacially displaced as mentioned. This displacement is shown in FIG. 9 by the beams 77. (The beams 77 represent the projection of the beams, if they were turned on before they reached line 78.) Line 78 represents a line perpendicular to the scan axis and this line is shown in FIG. 8 through scan line 70. As each of the beams reach line 78 they are activated (one at a time) as a function of the information (binary one or zero) accessed for address unit at that position along the scan axis and stripe axis. In operation, the data signals controlling the beams are sequentially applied to the AOM 16 of FIG. 1; each signal is delayed by an appropriate amount so that the beam is turned on (if needed for the pattern) along line 78 and the equidistant lines. This allows the projection of the beams to overlap without having the beams themselves overlap. If the beams themselves overlap, uncontrolled interference occurs, preventing a "clean" scan line from being written.

TABLE ASSEMBLY

Figure 7:
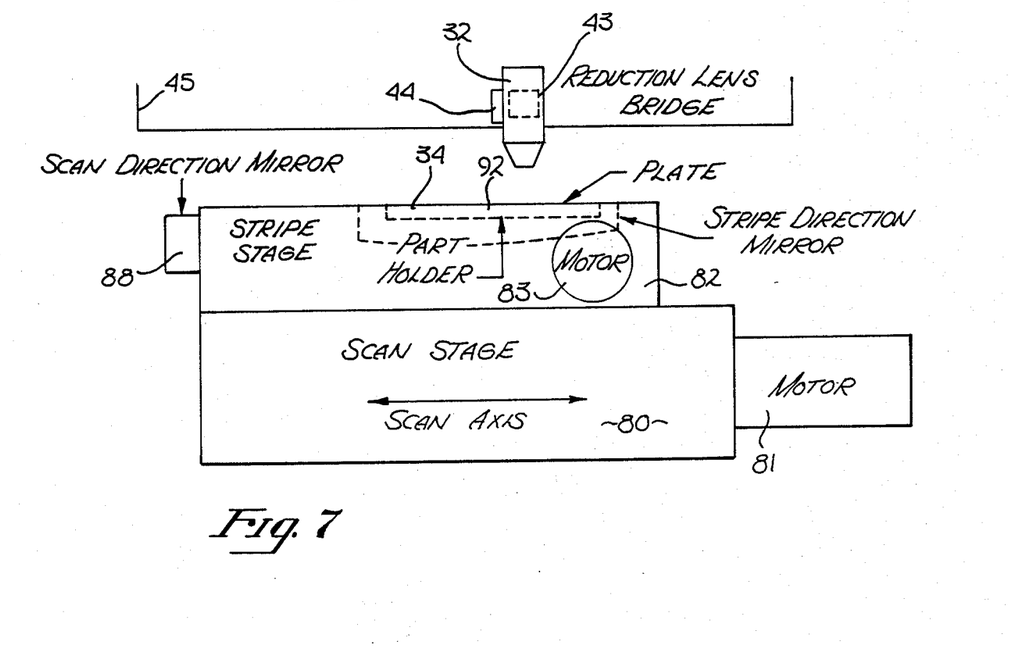
FIG. 7 is an elevation view of the structure of FIG. 6 and also illustrates the structure's position relative to the reduction of the optical path.

Referring first to FIG. 7, the plate 34 which is mounted in the partholder can be moved in three axes. Movement to and from the reduction lenses 32 (Z axis) is not illustrated in the drawings. This movement is done for focusing.

During pattern generation, as mentioned, the plate 34 and partholder are moved along the stripe axis by motor 83 since they are mounted on the stripe stage 82. This axis for the view of FIG. 7 is into and out of the drawing. The stripe stage 82 is mounted on the scan stage 80, thereby causing the plate 34 to move when the stage 80 moves. The stage 80 moves along the scan axis and is driven by motor 81. As mentioned, this movement does not occur during scanning, but rather, for instance, between scans to reposition for each pass. The partholder may also be adjusted (tilted) to level the workpiece relative to the beams.

Figure 6:
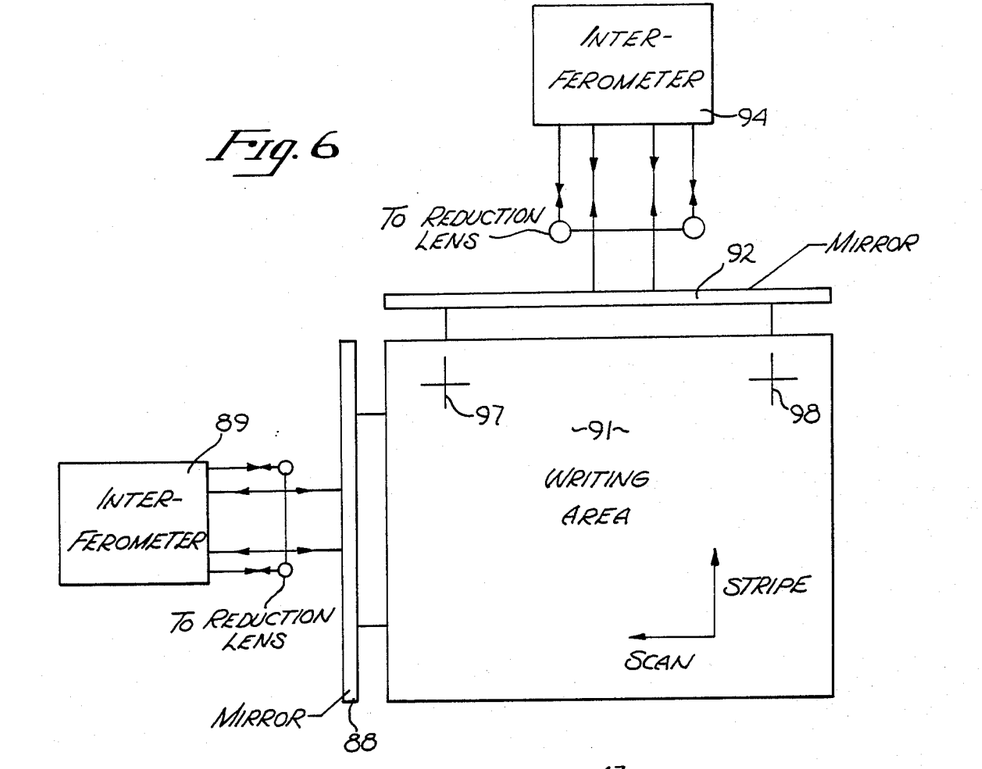
FIG. 6 is a plan view of the part holder and its relationship to interferometers which are used in the determination of part holder or workpiece position.

Referring to FIGS. 6 and 7, a mirror 88 is mounted perpendicular on the stage 82, and similarly, a mirror 92 is mounted on stage 82 perpendicular to the stripe axis. A mirror 44 is mounted on the reduction lens 32 perpendicular to the scan axis, and similarly, a mirror 43 is mounted on the reduction lens 32 perpendicular to the stripe axis. Relative movement in the scan direction between the stage 82 and lens 32 is detected by a differential interferometer 89. This differential interferometer reflects a pair of beams from each of the mirrors 44 and 88. Similarly, relative movement in the stripe direction is detected by the differential interferometer 94 as light is reflected for mirrors 43 and 92. The light is reflected from mirrors 82 and 92 at the level of the plate 34 to obtain accurate relative movement of the plate.

The differential interferometers 89 and 94 are commercially available interferometers.

The interferometers along with the photomultiplier tube of FIG. 5 which receives the light reflected from the workpiece (see surface 28b of beam splitter 28, FIG. 4) play an important role in the calibration of the apparatus and in position determination of the workpiece.

Calibration marks 97 and 98 are formed on the upper surface of the part holder. These marks can alternatively be formed on the plate itself (e.g., with chrome disposition and etching steps). These marks have a known displacement from a pattern origin. The pattern data is generated relative to this origin. When one of the eight beams is turned on, reflection from the markers 97 and 98 can be sensed by the photomultiplier tube. This provides accurate data on the relative position of the pattern origin and beam. When the workpiece is moved either in the scan or stripe directions, accurate position data is available from the interferometers, thus providing a continuous stream of position data.

There are numerous other uses for the combination of the data from the interferometer and photomultiplier tube. For instance, as previously mentioned, a scan line is 4096 address units in length. Beam 1 for address unit one can first be activated and its coordinates determined by the photomultiplier tube in conjunction with a marker. Then beam 1 can again be turned on for the 4096 address unit of the scan and this position determined with a marker. From this data the length of a scan line can be determined. Similarly, the width of the brush can be determined by activating beams 1 and 8. The skew in the stripe axis caused by workpiece motion during scanning can also be determined and adjusted for electrically by adjusting the time at which data is applied to the AOM. Other applications include spot size measurement, critical dimension measurements, rotating mirror rotation stability tests, steering mirror positioning, zoom lens calibration, timing calibration, F-theta transfer function measurements, determination of lens linearity throughout the entire optics system, focal field flatness measurement, column orthogonality testing and auto focus calibration.

The telecentric arrangement of the intermediate field plane with the combination of the beam splitter and photomultiplier tube along with the interferometers and marks on the moving assembly provide precise coordination between these otherwise independent subsystems.

DATA TIMING

The timing of the data relative to mirror position is important. If the beams are turned on too early or too late relative to the position of each of the facets on the rotating mirror, one scan line can be displaced from the next. As previously mentioned, the timing signals for the data and the enabling of the AOM, are developed through the facet detector. Channel one is turned on before the facet is in a position to cause a beam or beams to be directed onto the workpiece. The beam is reflected from splitter 28 onto a photodetector to generate a timing pulse. The turning on of this beam is illustrated by pulse 105 in FIG. 10. The facet detection is shown by pulse 106 in FIG. 10. This detection initiates a time sequence which consists of a fixed delay, a scan correction and a skew correction. The total delay is shown as delay 108 in FIG. 10.

After the delay the print clock enable signal 107 enables the pixel clock 109 to generate the signals for clocking the date (4096 address units) into the AOM. As shown by waveform 110 the data selectively enables the beams to print the pattern.

A stripe 111 which comprises a plurality of scans is shown in FIG. 10. Line 112 represents a time axis for the stripe 111. Line 113 illustrates an angle added to line 112; this angle represents the skew introduced into each scan line caused by the movement in the stripe direction during scanning. This is the "skew factor increment" in the delay 108. The dotted line represents scan direction deviation from true stripe axis movement. This deviation is measured by interferometer 94. The difference between the dotted line and line 112 represents the "scan correction" for the delay 108. The "fixed" delay is the average expected delay. The computed delay 108 thus allows the printing to occur where intended despite facet deviation, the raster nature of the scanning and stripe table movement deviation.

During scanning, non-constant velocity table movement may also occur in the stripe axis direction. These variations are detected by interferometer 89. The information from interferometer 89 controls the steering mirror 20 and corrects relative beam-workpiece movement in the stripe direction.

Thus, a laser pattern generation apparatus has been described which includes numerous unique features, both in its optical path and as part of its mechanical subsystem.

What is claimed is:

1. An apparatus for generating a pattern on a workpiece which includes a film responsive to radiant energy comprising:
    a laser for providing a radiant energy beam;
    beam splitting means for splitting a beam into a plurality of beams, said beam splitting means being optically coupled to said laser;
    modulation means for independently modulating each of said plurality of beams, said modulation means being optically coupled to said beam splitting means;
    rotating mirror having a plurality of facets for causing said beams to scan said workpiece, said beams from said modulation means being directed onto said rotating mirror;
    focusing means for receiving said beams from said rotating mirror and for focusing said beams onto said workpiece;
    a part holder for receiving said workpiece;
    a steering mirror for adjusting the position of said beams on said rotating mirror during operation of said apparatus to compensate for movement between said partholder and said beams, said steering mirror being optically disposed between said modulation means and said rotating mirror;
    movement detection means for detecting movement of said partholder, said movement detection means for providing information for adjustment of said steering mirror relative to movement of said partholder during scanning of said workpiece;
    whereby a pattern is generated on said workpiece.

2. The apparatus defined by claim 1 including optical means for providing an enlarged image plane between said rotating mirror and said workpiece.

3. The apparatus defined by claim 2 wherein said optical means includes a beam splitter in said enlarged image plane for reflecting a beam from said rotating mirror to a facet detection means for providing synchronization signals synchronized with said facets of said rotating mirror.

4. The apparatus defined by claim 3 wherein at least one of said plurality of beams is reflected from said workpiece and reflected by said beam splitter to a detector to provide an indication of the position of said workpiece.

5. The apparatus defined by claim 2 wherein said optical means includes and F-theta lens.

6. The apparatus defined by claim 1 including a dove prism disposed between said modulation means and said rotating mirror, said prism for providing separation between said plurality of beams to prevent interference between said beams.

7. The apparatus defined by claim 1 including a zoom lens disposed between said modulation means and said rotating mirror.

8. The apparatus defined by claim 1 or claim 4 wherein said modulation means comprises an acousto-optical device.

9. The apparatus defined by claim 1 wherein said beam splitting means includes a first beam splitting mirror for receiving said beam from said laser and for splitting said beam into two beams, a second beam splitting means for receiving said two beams from said first mirror and for splitting said two beams into four beams, and a third beam splitting means for receiving said four beams from said second mirror and for splitting said four beams into eight beams.

10. An apparatus for generating a pattern on a workpiece which includes a film responsive to radiant energy comprising:
    at least one laser for providing radiant energy beams;
    a splitting and modulation means for receiving said beam from said laser and for providing a plurality of modulated laser beams;
    rotating mirror having a plurality of facets, said beams from said modulation means being directed onto said rotating mirror;
    focusing means for receiving said beams from said rotating mirror and for focusing said beams onto said workpiece, said focusing means including optical means for providing an enlarged image plane between said rotating mirror and said workpiece;
    a beam splitter in said enlarged image plane for reflecting a beam from said rotating mirror to a facet detection means for providing synchronization signals synchronized with said facets of said rotating mirror;
    calibration and position detection means optically coupled with said workpiece for providing calibration and position detection information;
    whereby said rotating mirror causes said plurality of beams to scan said workpiece.

11. The apparatus defined by claim 10 wherein said splitting and modulation means includes a first beam splitting mirror for receiving said beam from said laser and for splitting said beam into two beams, a second beam splitting means for receiving said two beams from said first mirror and for splitting said two beams into four beams, and a third beam splitting means for receiving said four beams from said second mirror and for splitting said four beams into eight beams.

12. The apparatus defined by claim 10 wherein said optical means for providing said enlarged image plane includes an F-theta lens.

13. The apparatus defined by claim 10 including a dove prism disposed between said modulation means and said rotating mirror, said prism for providing separation between said plurality of beams to prevent interference between said beams.

14. The apparatus defined by claim 10 including a zoom lens disposed between said modulation means and said rotating mirror.

15. The apparatus defined by claim 10 including a steering mirror disposed between said modulation means and said rotating mirror for adjusting the position of said beams on said rotating mirror to compensate for movement between said workpiece and said beams.

16. An apparatus for generating a pattern on a workpiece which includes a film responsive to radiant energy comprising:
   a laser for providing a radiant energy beam;
   beam splitting means for splitting a beam into a plurality of beams, said beam splitting means being optically coupled to said laser;
   acousto-optic modulation means for independently modulating each of said plurality of beams, said modulation means being optically coupled to said beam splitting means;
   rotating mirror having a plurality of facets, said beams from said modulation means being directed onto said rotating mirror;
   focusing means for receiving said beams from said rotating mirror and for focusing said beams onto said workpiece;
   a partholder for receiving said workpiece said partholder being mounted for movement in a direction perpendicular to said scan direction;
   a steering mirror disposed between said modulation means and said rotating mirror, said beams striking said steering mirror at a focal point with respect to said pattern image on said workpiece to compensate for relative beam-workpiece movement in said direction perpendicular to said scan direction;
   movement detection means for detecting movement of said partholder, said movement detection means for providing information for adjustment of said steering mirror relative to non-constant velocity partholder movement during scanning of said workpiece;
   whereby said rotating mirror and said partholder movement causes said workpiece to be raster scanned in a predetermined path in said direction perpendicular to said scan direction and said steering mirror to adjusts said beams to compensate for nonconstant velocity movement of said partholder.

17. The apparatus defined by claim 16 wherein said partholder is mounted on a table which moves in said scan direction.

18. The apparatus defined by claim 17 incuding a beam splitter for reflecting a beam from said rotating mirror to a facet detection means for providing synchronization signals synchronized with said facets of said rotating mirror.

19. The apparatus defined by claim 16 wherein at least one of said plurality of beams is reflected from said workpiece and reflected by a beam splitter to provide an indication of the position of said workpiece.

20. The apparatus defined by claim 16 or 19 including a fourth mirror mounted for movement with said partholder and a first interferometer to permit detection of movement of said partholder in said direction perpendicular to said scan direction.

21. The apparatus defined by claim 20 including a fifth mirror mounted for movement with said partholder and a second interferometer to permit detection of movement of said partholder in said scan direction.

22. The apparatus defined by claim 16 including an enlarged image plane between said rotating mirror and said workpiece.

23. The apparatus defined by claim 22 including a beam splitter in said enlarged image plane for reflecting one of said beams from said rotating mirror to a facet detection means for providing synchronization signals synchronized with said facets of said rotating mirror, said one beam being turned on prior to said beams scanning said workpiece.

24. The apparatus defined by claim 23 wherein at least one of said plurality of beams is reflected from said workpiece and reflected by said beam splitter to provide an indication of the position of said workpiece.

25. The apparatus defined by claim 22 wherein for said enlarged image plane includes an F-theta lens.

26. The apparatus defined by claim 16 including a dove prism disposed between said acousto-optic modulation means and said rotating mirror, said prism for providing separation between said plurality of beams to prevent interference between said beams.

27. The apparatus defined by claim 16 including a zoom lens disposed between said acousto-optic modulation means and said rotating mirror.

28. The apparatus defined by claim 16 wherein said beam splitting means includes a first beam splitting mirror for receiving said beam from said laser and for splitting said beam into two beams, a second beam splitting means for receiving said two beams from said first mirror and for splitting said two beams into four beams, and a third beam splitting means for receiving said four beams from said second mirror and for splitting said four beams into eight beams.

* * * * *